(12) United States Patent
Dupont-Nivet et al.

(10) Patent No.: US 10,436,811 B2
(45) Date of Patent: Oct. 8, 2019

(54) LASER SOURCE FOR A COLD-ATOM INERTIAL SENSOR

(71) Applicant: THALES, Courbevoie (FR)

(72) Inventors: Matthieu Dupont-Nivet, Paris (FR); Sylvain Schwartz, Saint Remy les Chevreuse (FR); Arnaud Brignon, Bourg la Reine (FR); Jérôme Bourderionnet, Sucy en Brie (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/778,607

(22) PCT Filed: Nov. 7, 2016

(86) PCT No.: PCT/EP2016/076837
§ 371 (c)(1),
(2) Date: May 23, 2018

(87) PCT Pub. No.: WO2017/089106
PCT Pub. Date: Jun. 1, 2017

(65) Prior Publication Data
US 2018/0356441 A1    Dec. 13, 2018

(30) Foreign Application Priority Data

Nov. 27, 2015   (FR) .................................... 15 02484

(51) Int. Cl.
*G01C 19/58* (2006.01)
*G01C 19/60* (2006.01)
(Continued)

(52) U.S. Cl.
CPC ............ *G01P 15/093* (2013.01); *G01C 19/58* (2013.01); *G01P 15/08* (2013.01); *H01S 3/1303* (2013.01);
(Continued)

(58) Field of Classification Search
CPC ........ G01C 19/58; G01C 19/60; G01C 19/62; G01C 19/64
See application file for complete search history.

(56) References Cited

U.S. PATENT DOCUMENTS 7,933,020 B1 * 4/2011 Strandjord ........... G01C 19/727
356/461
2007/0242276 A1 * 10/2007 Hughes ................ G01C 19/727
356/461
(Continued)

FOREIGN PATENT DOCUMENTS

FR        3 019 691 A1   10/2015

OTHER PUBLICATIONS

High-precision gravity measurements using atom interferometry—A. Peters, K. Y. Chung and S. Chu A Peters et al 2001 Metrologia 38 25 (Year: 2001).*
(Continued)

*Primary Examiner* — Nicole M Ippolito
*Assistant Examiner* — Sean M Luck
(74) *Attorney, Agent, or Firm* — Baker & Hostetler LLP

(57) ABSTRACT

A laser-source assembly that is configured to illuminate a vacuum chamber containing atoms in the gaseous state so as to implement a cold-atom inertial sensor, the atoms having at least two fundamental levels that are separated by a fundamental frequency difference comprised between 1 and a few gigahertz, the assembly comprises: a master laser that emits a beam having a master frequency; a first control loop that is configured to stabilize the master frequency of the master laser on a frequency corresponding to half a set frequency of an atomic transition between a fundamental level and an excited level of the atoms; a slave laser that has a slave frequency; and a second control loop that is configured to stabilize the slave frequency of the slave laser with respect to the master frequency, the slave frequency being
(Continued)

offset with respect to the master frequency successively, over time, by a first preset offset value, a second preset offset value, and a third preset offset value, the offset values being comprised in an interval equal to half the fundamental frequency difference plus or minus a few hundred MHz.

13 Claims, 8 Drawing Sheets

(51) Int. Cl.

| | | |
|---|---|---|
| *G01C 19/62* | (2006.01) | |
| *G01C 19/64* | (2006.01) | |
| *G01P 15/093* | (2006.01) | |
| *G01P 15/08* | (2006.01) | |
| *H01S 3/13* | (2006.01) | |
| *H01S 5/02* | (2006.01) | |
| *H01S 5/026* | (2006.01) | |
| *H01S 5/068* | (2006.01) | |
| *H01S 5/0687* | (2006.01) | |
| *H01S 5/12* | (2006.01) | |
| *H01S 5/40* | (2006.01) | |
| *H01S 5/50* | (2006.01) | |
| *H01S 3/10* | (2006.01) | |
| *H01S 3/00* | (2006.01) | |

(52) U.S. Cl.
CPC ............ *H01S 3/1307* (2013.01); *H01S 5/021* (2013.01); *H01S 5/026* (2013.01); *H01S 5/0687* (2013.01); *H01S 5/06821* (2013.01); *H01S 5/12* (2013.01); *H01S 5/4025* (2013.01); *H01S 5/50* (2013.01); *H01S 3/0085* (2013.01); *H01S 3/10084* (2013.01)

(56) References Cited

U.S. PATENT DOCUMENTS

| | | | |
|---|---|---|---|
| 2011/0071787 A1* | 3/2011 | Gutty | G01C 19/66 702/130 |
| 2011/0273720 A1* | 11/2011 | Schwartz | G01C 19/667 356/467 |
| 2014/0016118 A1* | 1/2014 | Compton | G01N 21/00 356/72 |
| 2014/0022534 A1* | 1/2014 | Strabley | G01P 21/00 356/72 |
| 2014/0049780 A1* | 2/2014 | Sanders | G01C 19/727 356/461 |
| 2014/0211211 A1* | 7/2014 | Qiu | G01C 19/727 356/461 |

OTHER PUBLICATIONS

Carraz, et al., "Compact and robust laser system for onboard atom interferometry", Applied Physics B, vol. 97, No. 2, pp. 405-411, Aug. 6, 2009, XP019758878.

Nicole Byrne, "Phase Stabilization of Laser Beams in a Cold Atom Accelerometer," Jun. 1, 2014, XP055304191.

Amita Bikram Deb et al., "Versatile laser system for experiments with cold atomic gases," Journal of the Optical Society of America—B, vol. 29, No. 11, Nov. 1, 2012, pp. 3109, XP055304194.

Kohei Katayama, "Optical Phase Lock Loops and Raman-Cooling," Masterarbeit in Physik, Jan. 1, 2010, XP055341036.

* cited by examiner

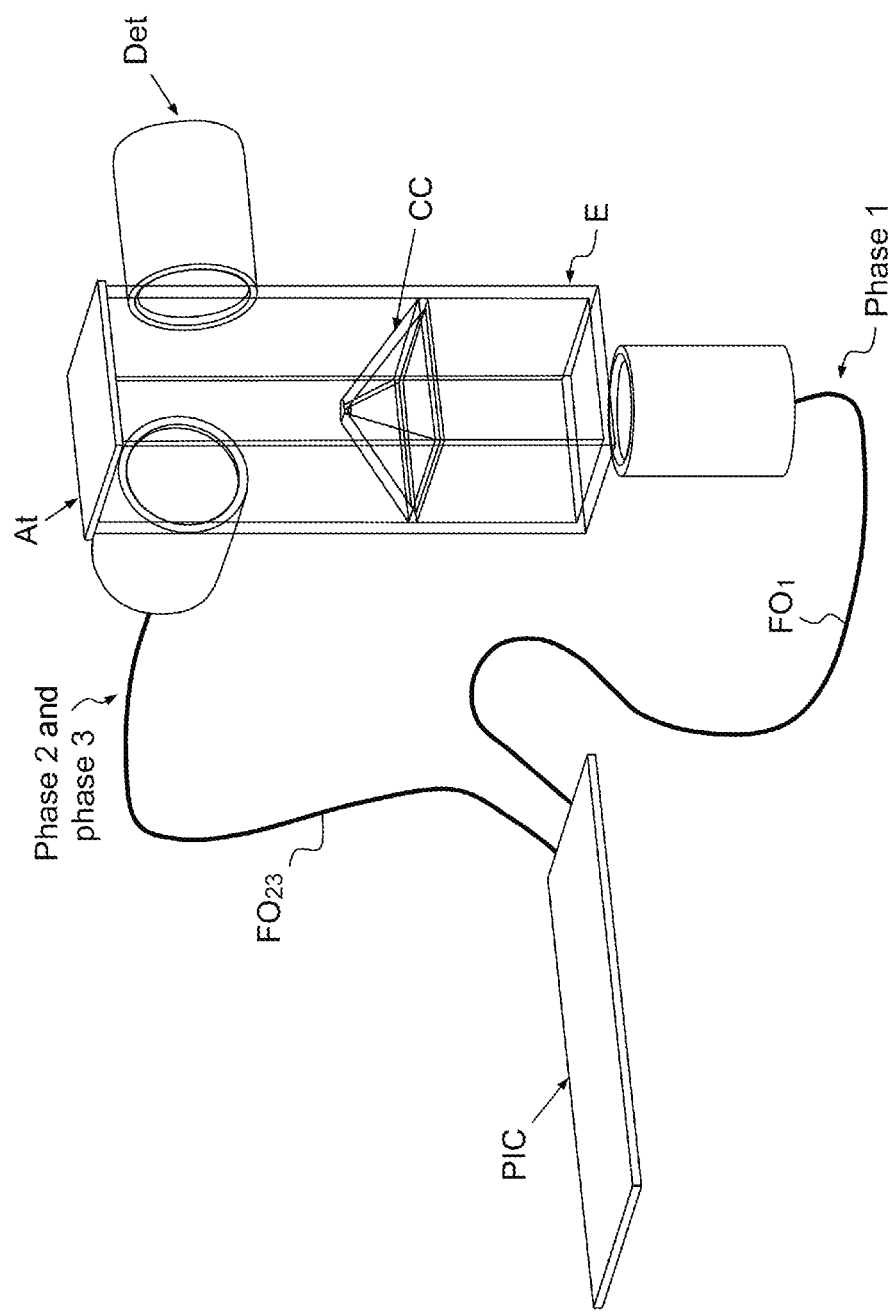

LASER SOURCE FOR A COLD-ATOM INERTIAL SENSOR

CROSS-REFERENCE TO RELATED APPLICATIONS

This application is a National Stage of International patent application PCT/EP2016/076837, filed on Nov. 7, 2016, which claims priority to foreign French patent application No. FR 1502484, filed on Nov. 27, 2015, the disclosures of which are incorporated by reference in their entirety.

FIELD OF THE INVENTION

The invention relates to the field of cold-atom inertial sensors. More particularly, the invention relates to the laser sources required to create the various laser beams for the implementation of the sensor.

BACKGROUND

Cold-atom sensors have already demonstrated excellent performance in the measurement of time (clocks) and of gravitational fields, of accelerations and of rotations. Their operating principle is recalled below.

The cold-atom sensors employed in atomic clocks use a gaseous cloud of atoms in a vacuum chamber. These atoms are such that they have two what are called "hyperfine" atomic levels that are separated in frequency by a quantity $\delta f_0$, which is of the order of a gigahertz, with $\delta f_0 = \omega_0/2\pi$, that is very stable and very well known. These atoms are typically atoms of rubidium 87, for which $\delta f_0 = 6.834$ GHz.

These atoms are initially in one of two fundamental states. A pulse generated by an oscillator with an angular frequency $\omega$ (called the $\pi/2$ pulse) is applied to these atoms, then a certain time $t_f$ is waited, then a second pulse that is identical to the first is applied. The atoms are then distributed between the two "hyperfine" fundamental states and the measurement of the respective populations of atoms allows the quantity $\omega_0 - \omega$ to be calculated, this allowing the oscillator to be locked on the atomic oscillation.

To measure an acceleration, the two fundamental states are separated spatially with magnetic fields. The measurement of the two populations of atoms subjected to the acceleration is proportional to:

$s = \omega_0 - \omega - m \cdot a \cdot d/\hbar$, where a is the acceleration to which the cloud is subjected, d the spatial separation of the fundamental states, $\hbar$ the reduced Planck constant and m the mass of the atom.

The acceleration is for example measured by measuring a movement of the fringes of a Ramsey interferometer in the frequency domain (typically as in a Mach-Zehnder interferometer in optics).

A sensitivity to the Sagnac effect is necessary to measure a speed of rotation. To achieve this, the atoms travel a closed path containing an area, this path being travelled in opposite directions by the two internal states.

To produce a cold-atom inertial sensor exploiting the effects described above, the measurement includes three main phases, a cooling phase, a pumping phase and a detecting phase.

By way of nonlimiting example, the principle of the sensor is described below for rubidium 87 atoms, rubidium 87 being the most commonly used type of atom, but other alkali atoms, such as atoms of rubidium 85 ($\delta f_0 = 3.0$ GHz) cesium ($\delta f_0 = 9.2$ GHz), sodium ($\delta f_0 = 1.7$ GHz) or potassium 40 ($\delta f_0 = 1.3$ GHz), having the same type of atomic structure may be used.

FIG. 1 illustrates the main atomic levels of interest of rubidium.

The two fundamental levels F=1 and F=2 are separated by $\delta f_0 = 6834$ MHz. The excited levels F'=0, 1, 2 or 3 are obtained by optical excitation in the vicinity of 780 nm, and are separated from one another by amounts comprised between 50 and 300 MHz.

FIG. 2 illustrates the frequencies required in the three aforementioned phases.

In the cooling phase, a three-dimensional magneto-optical trap is formed. To do this, the first laser L1, which is called the cooling laser, is regulated to a frequency $f_{Refroid}$ that is slightly below an excited level by a quantity $\epsilon 1$, typically comprised between a few MHz and about one hundred MHz. The atoms draw on their kinetic energy to reemit at the excitation frequency and slow down. Preferably, the frequency of the laser L1 is decreased by about one hundred MHz between the start and the end of the cooling phase. In practice, the initial beam of the laser is split into 3 beams that are used to slow the three directions, for example using a cube corner (see FIG. 8).

During the cooling, to get all the atoms to the same fundamental level, a second laser L2, called the "repump" laser, of frequency $f_{Repomp}$, is used to optically pump the atoms to one of the two hyperfine levels, for example F=2. The choice of the levels is based on the spectral selection rules of the atom in question.

Once the atoms have been cooled, the optical pumping second phase places all the atoms into a given Zeeman sub-level of the fundamental state F=2. A magnetic field is used to split the degeneracy of the various levels via the Zeeman effect. The cooling laser L1 is reused as pump laser (it then illuminates the atomic cloud in a different direction to during the cooling) for the pumping, which requires to be at a frequency $f_{pomp}$ that is below a set transition by a quantity $\epsilon 2$ of about 160 to 260 MHz, and the second "repump" laser L2 is also used to bring all the atoms to the same fundamental level.

In a detecting third phase (after a certain interferometry time) only the laser L1 is used, here as detection laser, with a frequency $f_{det}$ adjusted to an atomic resonance.

In a cold-atom inertial sensor according to the prior art such as illustrated in FIG. 3, the frequency f1 of the laser L1 and the frequency f2 of the laser L2 are each very precisely stabilized on an atomic frequency of rubidium using control loops BAet1 and BAet2 that each use a rubidium saturated absorption cell Cell1 and Cell2. The frequency of the laser L1 is stabilized from the fundamental state F=2 and the frequency of the "repump" laser L2 from the fundamental state F=1. The right frequencies for the two lasers L1 and L2 and for each measuring (cooling, then optical pumping then detecting) phase are obtained using a very complex optical system and at least 5 acousto-optical modulators. The AOM3 serves in the stabilization of the laser L1 on an atomic transition, and the AOM4 serves in the stabilization of the laser L2 on an atomic transition. The AOM7 serves in the realization of the cooling phase, the AOM6 serves in the realization of the optical pumping phase and the AOM1 serves in the detecting phase.

Existing solutions for producing the system required to cool and to manipulate cold atoms are of two types:

the entire system may be produced with fiber-based components: the assembly then fits into a bay of 1 m×1 m×2 m height, such a bulk being incompatible with any on-board application; or micromechanical technology, similar to the laser system of the Pharao atomic clock produced by the company Sodern, may be used: this solution is more compact than the preceding one but extremely costly because of the need to align and bond a very great number of miniature optical components.

One aim of the present invention is to mitigate the aforementioned drawbacks by providing a simplified laser-source assembly that is compatible with an integrated optic realization.

DESCRIPTION OF THE INVENTION

One subject of the present invention is a laser-source assembly that is configured to illuminate a vacuum chamber containing atoms in the gaseous state so as to implement a cold-atom inertial sensor, said atoms having at least two fundamental levels that are separated by a fundamental frequency difference comprised between 1 and a few gigahertz, the assembly comprising:

a master laser that emits a beam having a master frequency;

a first control loop that is configured to stabilize the master frequency of the master laser on a frequency corresponding to half a set frequency of an atomic transition between a fundamental level and an excited level of the atoms;

a slave laser that has a slave frequency; and a second control loop that is configured to stabilize the slave frequency of the slave laser with respect to the master frequency, the slave frequency being offset with respect to the master frequency successively, over time, by a first preset offset value, a second preset offset value, and a third preset offset value, the offset values being comprised in an interval equal to half the fundamental frequency difference plus or minus a few hundred MHz. The second control loop is made up of an optical phase-locked loop that is configured to achieve the stabilization on the basis of an error signal that is dependent on a phase difference between, on the one hand, a beat between the master frequency and the slave frequency, and, on the other hand, a reference signal having a reference frequency defined beforehand on the basis of a preset offset value, Preferably, the master frequency is set so that it corresponds to half a re-pumping frequency of the atoms, and the first, second and third successive slave frequency values correspond to the master frequency offset by the first offset value, second offset value and third offset value, respectively, and are set so that they correspond to half a cooling frequency, to half an optical pumping frequency and to half a detection frequency of the atoms during the implementation of an inertial sensor, respectively.

According to one embodiment, the optical phase-locked loop comprises:

a photodiode that is configured to detect the beat between the master frequency and the slave frequency;

a mixer that is configured to deliver, on the basis of said beat, a converted signal of lower frequency compatible with an operating range of a phase comparator;

a reference oscillator that is configured to deliver a radio reference signal having a radio reference frequency that is defined beforehand on the basis of a preset offset value;

a phase comparator that is configured to deliver an error signal that is dependent on the phase difference between the converted signal and the radio reference signal; and an electronic feedback device that is configured to act on the slave frequency of the slave laser so as to minimize said error signal.

Advantageously, the first control loop comprises a phase modulator, an amplifier, a frequency-doubling component and a saturable absorption cell comprising the same species of atoms as those used for the implementation of an inertial sensor.

Advantageously, the slave and master lasers are distributed feedback (DFB) lasers.

Advantageously the laser-source assembly according to the invention furthermore comprises a beam-forming stage comprising:

a plurality of optical amplifiers that are configured to amplify the beams generated by the frequency-stabilized lasers; and a plurality of frequency-doubling components that are configured to double the frequency of said amplified beams.

Advantageously, the laser sources emit a wavelength of 1560 nm (corresponding to the division by two of the optical frequency of rubidium) and the amplifiers are semiconductor optical amplifiers.

According to one preferred embodiment, the laser-source assembly according to the invention comprises, on a silicon substrate, a first integrated photonic circuit comprising the second control loop and some of the optical components required to generate the optical beams for the implementation of said sensor.

Advantageously, the first integrated photonic circuit furthermore comprises the phase modulator of the first control loop.

Preferably, the laser-source assembly according to one of the preceding claims comprising, on an InP substrate, a second integrated photonic circuit comprising the amplifiers and/or comprising a third integrated photonic circuit comprising the frequency-doubling components, which take the form of waveguides made of PPLN (for periodically poled lithium niobate).

Preferably, the first, and where appropriate the second and where appropriate the third integrated photonic circuit are hybridized so as to be integrated into the same chip.

Advantageously, the laser-source assembly according to the invention comprises a source integrated photonic circuit comprising the master laser, the slave laser and associated isolators.

Advantageously, the source integrated photonic circuit, the first integrated photonic circuit, the second integrated photonic circuit (PIC2) and the third integrated photonic circuit are hybridized so as to be integrated into the same chip.

Another subject of the invention is a cold-atom inertial sensor comprising a laser-source assembly according to the invention and furthermore comprising the vacuum chamber E containing the atoms At in the gaseous state.

BRIEF DESCRIPTION OF THE DRAWINGS

Other features, aims and advantages of the present invention will become apparent on reading the following detailed description with reference to the appended drawings, which are given by way of nonlimiting example and in which:

FIG. 8 illustrates an example of a cold-atom inertial sensor according to the invention.

DETAILED DESCRIPTION OF THE INVENTION

Figure 4:
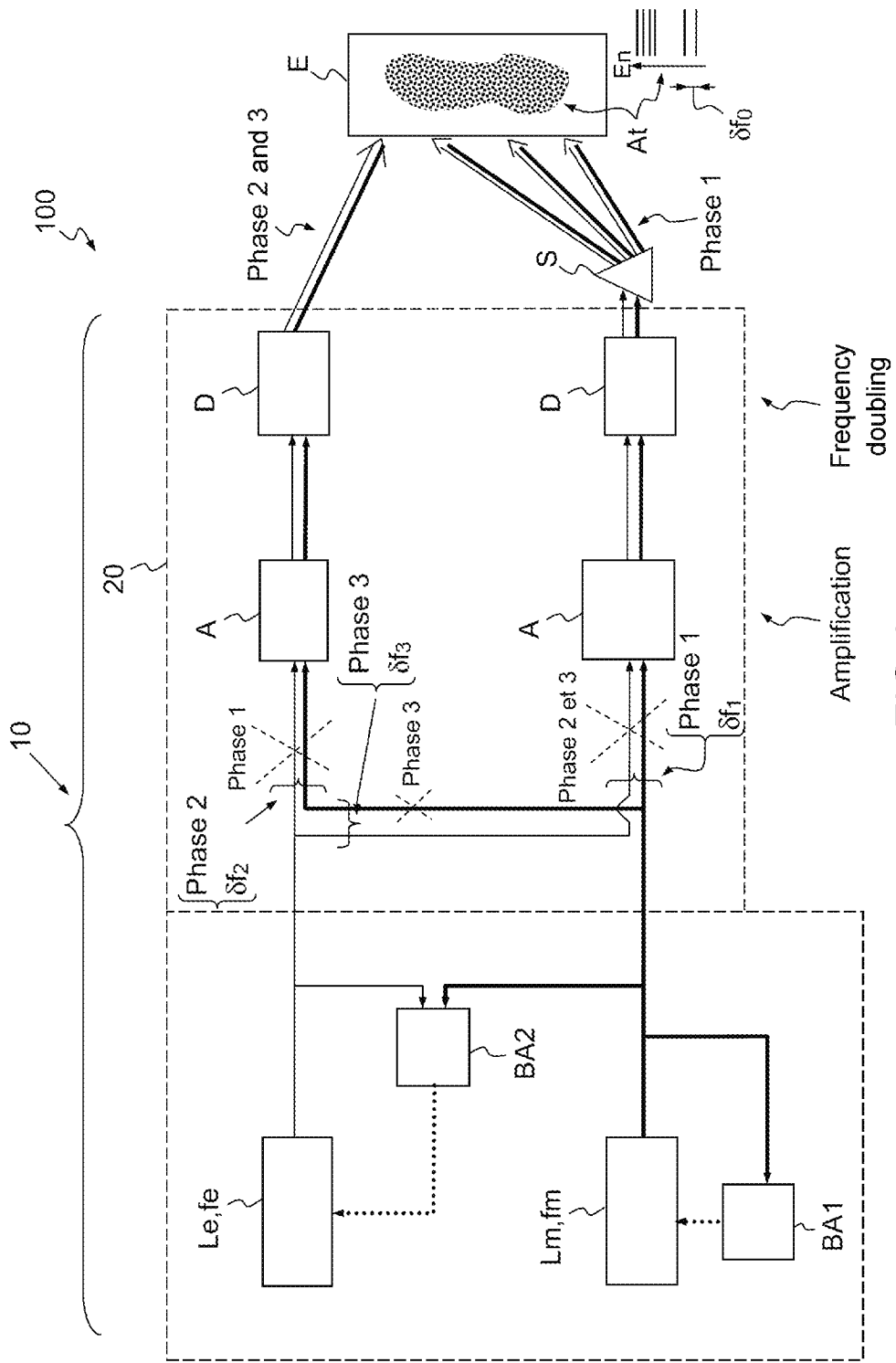
FIG. 4 schematically shows a laser-source assembly according to the invention.

FIG. 4 schematically shows a laser-source assembly 10 according to the invention for implementation of a cold-atom inertial sensor. The inertial sensor uses atoms in the gaseous state At trapped in a vacuum chamber E. The atoms At have at least two fundamental levels that are separated by a fundamental frequency difference $\delta f_0$ comprised between 1 and a few gigahertz.

Preferably, the atoms are rubidium 87 atoms, for which $\delta f_0 = 6.834$ GHz. However, various alkali atoms such as rubidium 85, cesium, sodium or potassium 40 may also be used.

The assembly 10 comprises a master laser Lm that emits a beam having a master frequency fm that is stabilized by a first control loop BA1 to a frequency corresponding to half a set frequency of an atomic transition between a fundamental level and an excited level of the atoms At. For the case of rubidium, the atoms pass from a fundamental level F=1 or F=2 to an excited level when they are optically excited with a wavelength of 780 nm. The first control loop BA1 comprises a rubidium cell Cell1, in order to be able to stabilize the master laser on half an atomic frequency (a frequency doubling system is used before transmission of the portion of the laser serving in the stabilization on the atoms). This control loop BA1 uses a phase modulator and the absorption signal generated by the atomic cell to carry out a Pound-Drever-Hall stabilization.

Half an atomic frequency is considered rather than the atomic frequency because the emission of the lasers is preferably substantially equal to a telecom wavelength (band C), for example for a rubidium-87 sensor the telecom wavelength being 1560 nm, which is then doubled in frequency to 780 nm before illuminating the sensor (in order to correspond to the optical transitions of the rubidium).

The assembly 10 furthermore comprises a slave laser Le, having a slave frequency fe that is stabilized with respect to the master frequency fm via a second control loop BA2. The slave frequency fe is offset with respect to the master frequency fm successively over time by a first preset offset value $\delta f1$, a second preset offset value $\delta f2$, and a third preset offset value $\delta f3$.

These offset values are comprised in an interval equal to half the fundamental frequency difference ($\delta f_0$) plus or minus a few hundred MHz.

Typically $\delta f1$ $\delta f2$, $\delta f3$ are comprised between [$\delta f_0/2-400$ MHz; $\delta f_0/2+400$ MHz].

Typically the frequency of the slave laser is lower than the frequency of the master laser.

These preset values must be obtained with a high precision, typically of about 1 to a few MHz.

For example for rubidium:

$\delta f_0 = 6.836$ GHz $2 \cdot \delta f1$, $2 \cdot \delta f2$, $2 \cdot \delta f3$ are comprised between [$\delta f_0 - 300$ MHz; $\delta f_0 + 300$ MHz] (see FIG. 5 below).

Half the fundamental frequency difference $\delta f_0$ is considered for the same reason as explained above.

Contrary to the laser-source assembly of the inertial sensor of the prior art, in which each of the frequencies f1 and f2 is stabilized on an atomic transition, using an atomic-gas cell Cell1, Cell2, the laser assembly according to the invention comprises a single atomic cell Cell1 in the first control loop BA1, the frequency of the slave laser fe being stabilized with respect to the frequency fm of the master laser, which remains fixed, and not with respect to an absolute, i.e. to a second atomic transition using a second cell. Thus, the frequency of the slave laser fe is adjusted with respect to fm to obtain the right values for the various phases of implementation of the sensor.

During the implementation of the inertial sensor, the master frequency fm of the master laser is set so that it corresponds to half the repumping frequency $f_{Repomp}$ of the atoms:

$$fm = f_{Repomp}/2$$

Since this frequency is fixed, the successive frequency values of the slave laser are set as follows:

Let fe1 be the first slave frequency value corresponding to the frequency applied to the slave laser during the cooling phase.

Let fe2 be the second slave frequency value corresponding to the frequency applied to the slave laser during the optical pumping phase.

Let fe3 be the third slave frequency value corresponding to the frequency applied to the slave laser during the detecting phase.

These successive frequency values correspond to the master frequency fm offset by the first offset value $\delta f1$, by the second offset value $\delta f2$, and by the third offset value $\delta f3$, respectively:

$$fe1 = fm - \delta f1,$$

$$fe2 = fm - \delta f2,$$

$$fe3 = fm - \delta f3$$

The offset value $\delta f1$ is set so that fe1 corresponds to half the cooling frequency $f_{Refroid}$ of the atoms At:

$$fe1 = f_{Refroid}/2$$

The offset value $\delta f2$ is set so that fe2 corresponds to half the optical pumping frequency $f_{Pomp}$ of the atoms At:

$$fe2 = f_{Pomp}/2$$

For example, for rubidium, the optical pumping is carried out to the atomic level |2,2>.

The offset value $\delta f3$ is set so that fe3 corresponds to half the detecting frequency frequency $f_{det}$ of the atoms At:

$$fe3 = f_{det}/2.$$

For example, for rubidium, the detection is carried out on the atomic transition from |2, $m_F$> to |3, $m_F$>.

Figure 2:
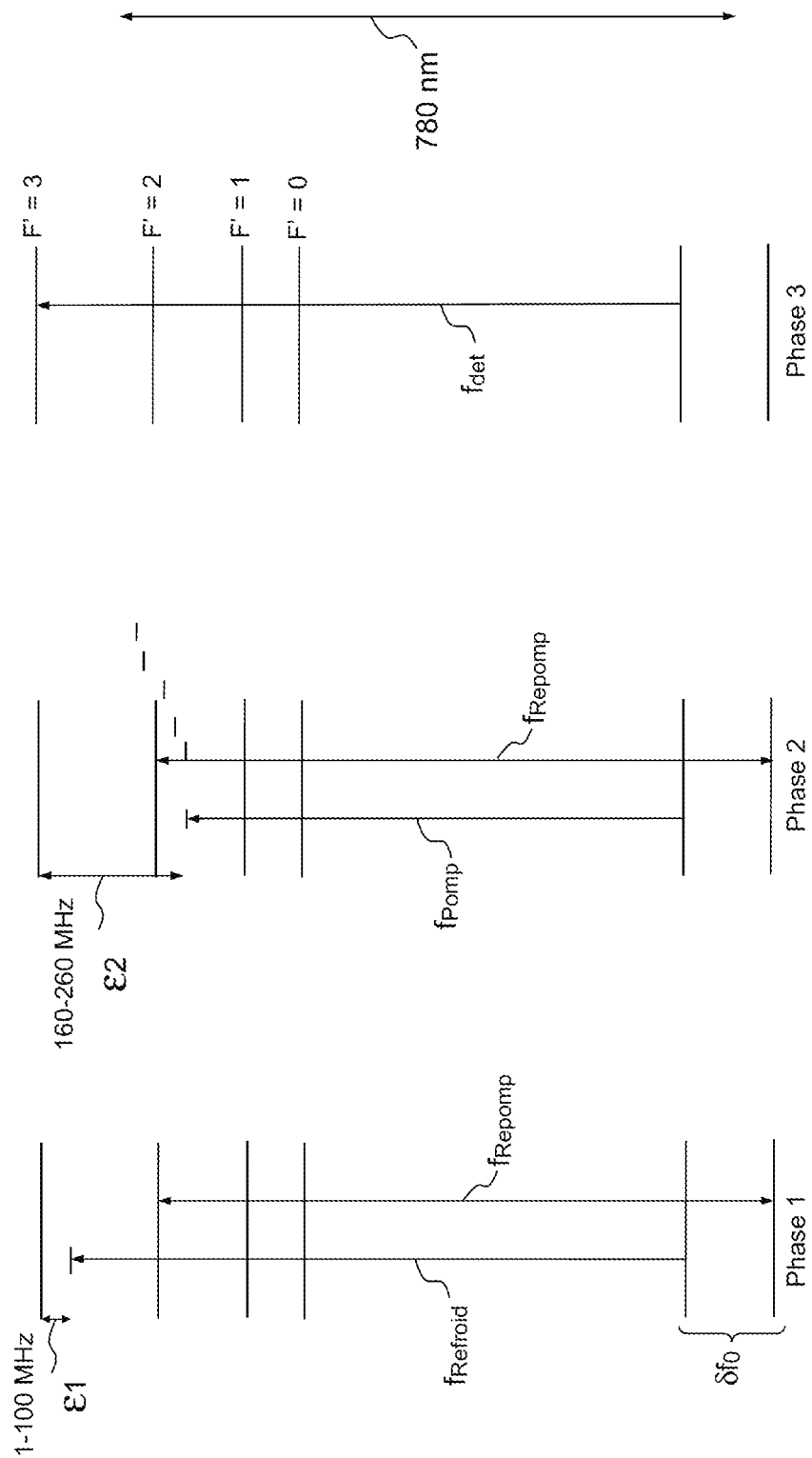
FIG. 2 illustrates the illumination frequencies used in the three phases of implementation of a cold-atom inertial sensor.
Figure 3:
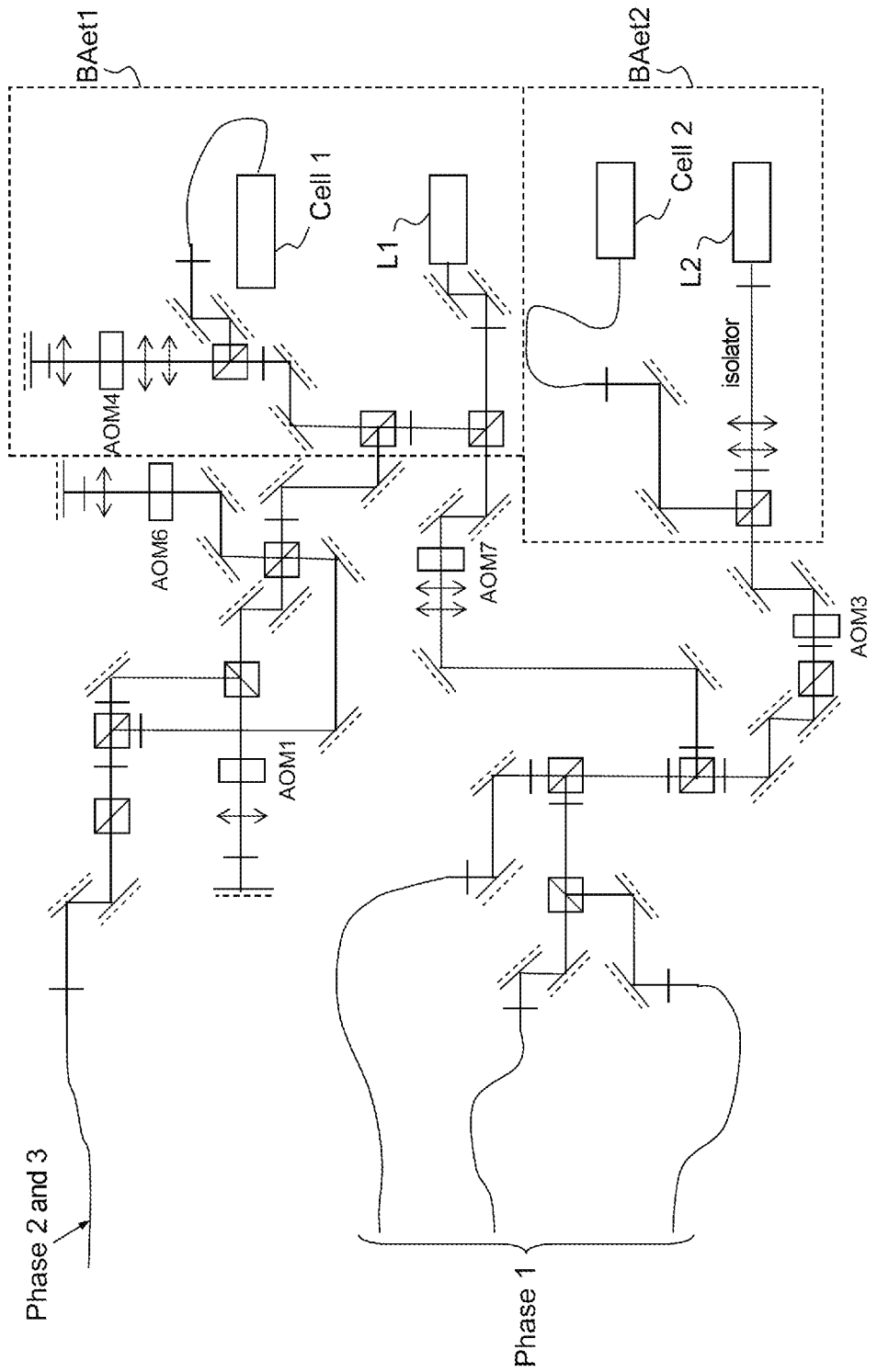
FIG. 3 schematically shows a laser-source assembly for an inertial sensor according to the prior art.

It may clearly be seen in FIG. 2 that the various frequencies fe1 ($f_{Refroid}/2$), fe2 ($f_{Pomp}/2$) and fe3 ($f_{det}/2$) are offset with respect to the frequency of the master laser fm ($f_{Repomp}/2$) by a offset value close to $\delta f_0/2$ to a few hundred MHz, this value needing to be obtained with a high precision. The repumping frequency depopulates level F=1, whilst the frequencies fe1, fe2 and fe3 excite the atoms from the level F=2.

It will be noted in the invention that the two, master and slave, lasers are used to generate the various beams necessary for the implementation of the sensor. It is in this case necessary for each of the beams generated by these two lasers to be phase locked (see below) in order to produce, for example, Raman transitions that serve to interact with the atoms during the interrogation of the sensor.

On account of the values of the atomic transitions of the atoms usable for the implementation of a cold-atom inertial sensor, use is preferably made of:

$$fei = fm - \delta fi, \text{ where } i=1,2,3$$

and where $\delta fi$ is comprised in the interval $[\delta f_0/2-800 \text{ MHz}; \delta f_0/2+800 \text{ MHz}]$.

It will be noted that the cooling, which consists in forming a three-dimensional magneto-optical trap in the chamber, typically requires 3 beams, which are commonly denoted 3-D MOT X1, X2 and H, and which may be obtained from a single beam (see below).

It will also be noted that the objective of the steps of pumping and detecting is to get the atoms into the right state before the interferometric sequence, in the implementation of an inertial sensor. Since the pump and detection beams are not used at the same time in the measurement cycle of the sensor, it is possible to use the same output to illuminate the chamber.

Preferably, the master laser Lm and the slave laser Le of the laser-source assembly 10 are grating laser diodes, or a strip of laser diodes, of distributed-feed-back (DFB) or distributed-Bragg-reflector (DBR) type emitting a telecom wavelength, advantageously 1560 nm.

The slave laser Le is stabilized to the master laser by detecting a beat between the two lasers using a photodiode, then by carrying out a stabilization based on the principle of an optical phase-locked loop (OPLL) such as described below.

The phase locking of the master and slave beams makes it possible to obtain both a coherence between the two beams and predefined values of the frequency differences between master laser and slave laser.

According to one preferred embodiment, the laser-source assembly 10 according to the invention also comprises a beam-forming stage 20, which is also illustrated in FIG. 4 and which comprises:
  A plurality of optical amplifiers A campaign that are configured to amplify the beams generated by the frequency-stabilized lasers. Advantageously, the amplifiers are semiconductor optical amplifiers (SOA).
  A plurality of frequency-doubling components D that are configured to double the frequency of the amplified beams. In the preceding example of an emission at 1560 nm, the doubled beam has a wavelength of 780 nm compatible with the excitation of the aforementioned atoms for the implementation of a cold-atom inertial sensor.

The laser-source assembly also comprises various components for the manipulation of the beams generated by the master and slave lasers: these beams generated by the lasers are split, attenuated and recombined to form beams that are intended to be amplified then doubled so as to generate beams that are configured to illuminate the chamber of a cold-atom sensor so as to implement a cooling phase 1, a pumping phase 2 and a detecting phase 3 during a measurement carried out during the implementation of the sensor.

In the cooling phase 1, the beams at the top of FIG. 4 are cut, and the cell is illuminated with the beams at the bottom of FIG. 4. In the pumping phase 2, the beams at the bottom of FIG. 4 are cut, and the cell is illuminated with the beams at the top of FIG. 4.

In the detecting phase 3, the beams at the bottom of FIG. 4 are cut, as is the beam at the top of the figure, which originates from the master laser, which nevertheless remains turned on in order to carry out the frequency stabilization of fe3 with respect to fm.

Figure 5:
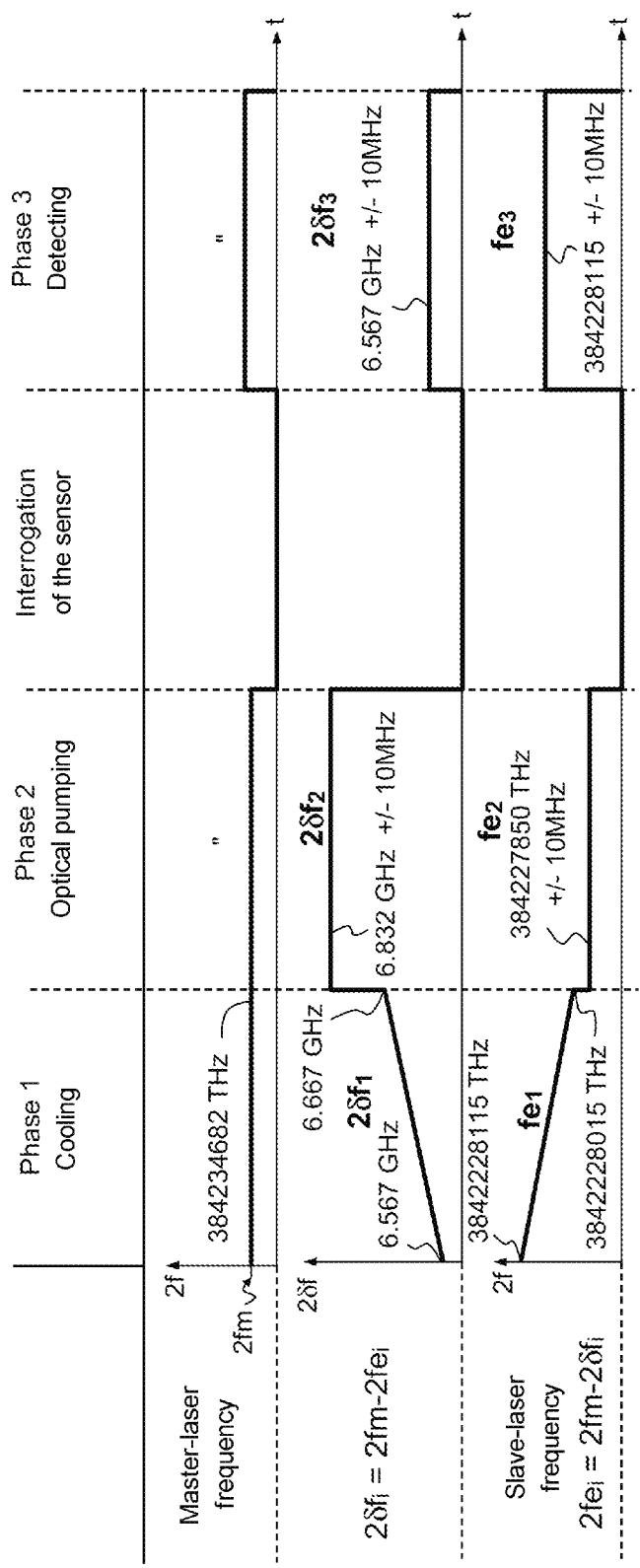
FIG. 5 describes the various frequencies and offset values for the implementation of a cold-atom sensor based on rubidium atoms.

A nonlimiting example of offset values Oft $\delta f2$, $\delta f3$ to be achieved with the loop BA2 is illustrated in FIG. 5 for rubidium. The master frequency fm is given in THz and corresponds to an optical wavelength of about 780 nm, as described above, with a $\delta f_0$ between the fundamental state F=1 and the fundamental state F=2 of 6834 GHz. The frequency of the master laser is regulated to half the what is called "repumping" frequency $f_{Repomp}$ such as illustrated in FIG. 2.

In the cooling phase, the frequency fe1 corresponds to the frequency of the master laser fm decreased by $\delta f1$ with:

$$2 \cdot \delta f1 \text{ varies between } \delta f_0 - 267 \text{ MHz and } \delta f_0 - 167 \text{ MHz}$$

In the pumping phase, the frequency fe2 corresponds to the frequency of the master laser fm decreased by $\delta f2$ with:

$$2 \cdot \delta f2 = \delta f_0 - 2 \text{ MHz}$$

In the detecting phase, the frequency fe3 corresponds to the frequency of the master laser fm decreased by $\delta f3$ with:

$$2 \cdot \delta f3 = \delta f_0 - 267 \text{ MHz}$$

Figure 1:
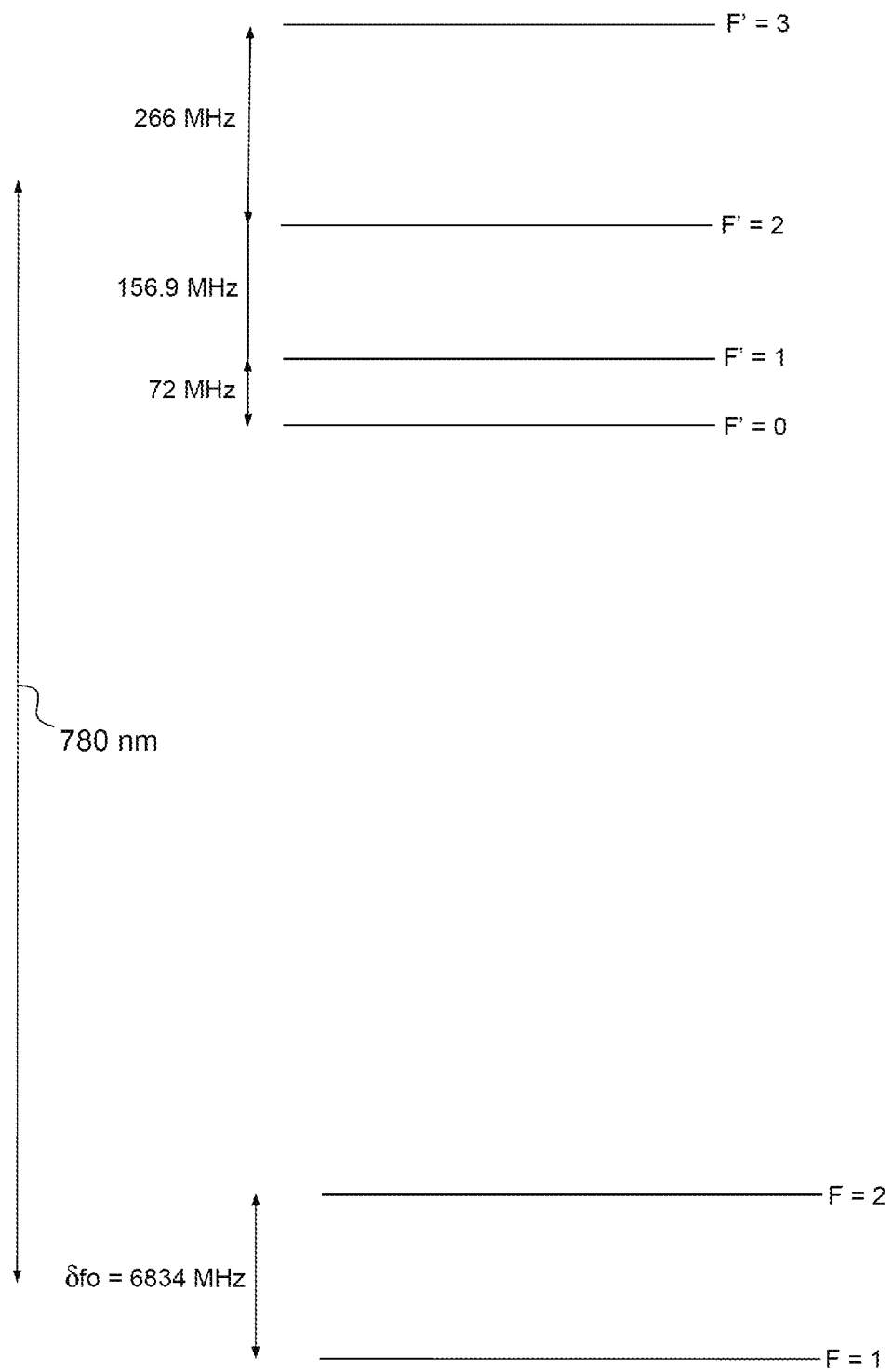
FIG. 1 illustrates the main atomic levels of interest of rubidium.

These offset values are determined on the basis of the known values of the atomic energy levels (see FIGS. 1 and 2) and of the physics of the cold-atom sensors. The desired precision in the slave-frequency value, and therefore in the offset values, is preferably about 1 to a few MHz.

Preferably, the first control loop BA1 comprises a phase modulator Mod φ, an amplifier, a frequency-doubling component and a saturable absorption cell Cell1 containing atoms At of the same material as that used in the chamber of the sensor, such as described above.

According to one preferred embodiment, the second control loop BA2 is based on the principle of phase-locked loops PLLs, and is able to act on the relative phase between two optical beams by transposition to an electrical signal. This method is referred to as an optical phase-locked loop or OPLL.

Figure 6:
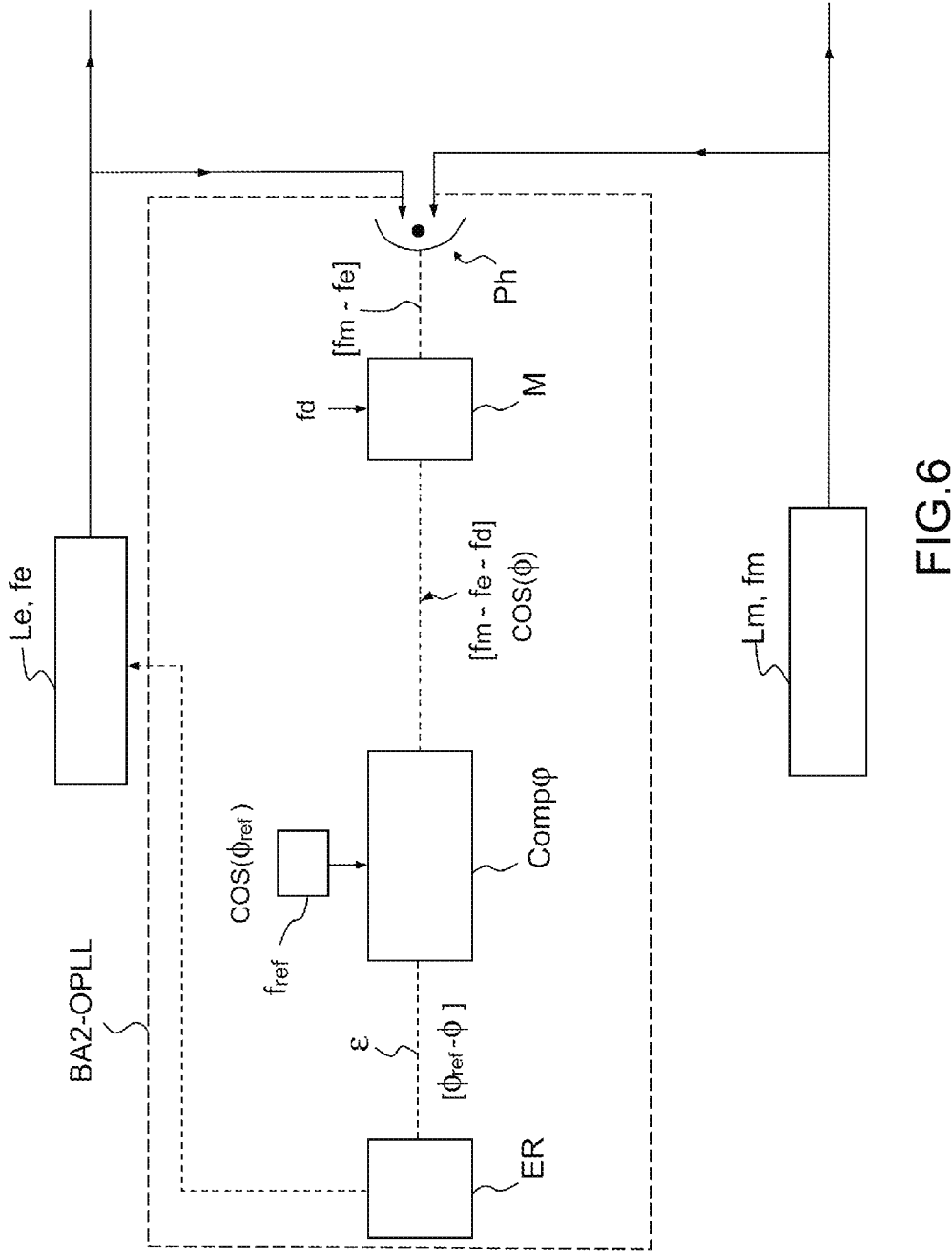
FIG. 6 illustrates the operating mode of a second control loop using an optical phase-locked loop.

The principle of such a stabilization is illustrated in FIG. 6.

It will be recalled that the frequency of a signal f is proportional to the derivative of the phase φ of the signal with respect to time. Making the phase difference between the slave signal to be stabilized and a reference signal, zero for example, allows a slave frequency stabilized (made equal) to the reference frequency to be obtained.

In other words, the second control loop BA2 is formed on the basis of an optical phase-locked loop OPLL that is configured to carry out the stabilization on the basis of an error signal c that is dependent on a phase difference between, on the one hand, the beat fm-fe between the master frequency and the slave frequency, and, on the other hand, a reference signal having a reference frequency fref defined beforehand on the basis of a preset offset value $\delta f1$, $\delta f2$ or $\delta f3$.

According to one preferred embodiment, the phase-locked loop OPLL comprises a photodiode Ph that detects the optical beams generated by the slave and master laser, and more particularly the beat signal between these frequencies, frequency fm-fe. The frequency of the slave laser fe is stabilized on the frequency of the master laser fm (itself directly stabilized on an atomic reference), on the basis of this beat fm-fe, which is adjusted to a value close to $\delta f0/2$ (3.418 GHz for rubidium), and which must be modifiable by a few hundred MHz, for example between −150 MHz and +50 MHz, repeatedly and in a time of about 1 millisecond.

Phase comparison between signals of the order of a gigahertz being very complex to implement, a conversion of the beat frequency fm-fe to a converted signal of lower frequency fm-fe-fd is carried out using a mixer M, this operation being referred to as a down conversion. The aim is to make the frequency of the signal to be stabilized compatible with the operating range of the phase comparator Compφ. The obtained signal of frequency fm-fe-fd and of phase $\phi=2\pi(fm\text{-}fe\text{-}fd)t+\phi 1$ typically has a frequency comprised between 1 and 500 MHz. Preferably, a filter is added after the mixer in order to select only the signal of interest of frequency fm-fe-fd in the desired range.

The OPLL loop also comprises a reference oscillator Oref that is configured to generate a radio reference signal having a radio reference frequency frefr and a reference phase $\phi ref=2\pi\cdot frefr\cdot t+\phi 2$, the frequency frefr being defined beforehand on the basis of a desired preset offset value either $\delta f1$ or $\delta f2$ or $\delta f3$. The frequency of the radio reference signal frefr is typically in the radio frequency domain, comprised between 1 and 500 MHz.

Next, the phase comparator Compφ generates an error signal c that is dependent on the phase difference $\phi-\phi ref$ between the converted signal and the radio reference signal.

Finally, a feedback electronic device ER generates a correction signal and acts on the slave frequency fe of the slave laser so as to minimize the error signal ε. In the case of a DFB laser diode typically the supply current of the laser is acted on, the optical frequency being a function of this current.

Typically, on turn-on, after a certain time, the frequency of the converted beat signal locks on the chosen frequency frefr of the oscillator.

The advantage of using an OPLL loop is that it is compatible with the orders of magnitudes of the offsets to be applied and with an integrated photonic implementation, this allowing the bulk and overall cost of a cold-atom inertial sensor to be drastically decreased.

The invention also relates to a cold-atom inertial sensor 100, also illustrated in FIG. 4, comprising a laser-source assembly 10 and furthermore comprising a vacuum chamber E containing trapped atoms At in the gaseous state, said chamber being illuminated by the beams generated by the complete laser-source assembly.

In the schematic of FIG. 4, a splitter S, for example a cube corner is used, on the already amplified beam, to split the beam into three for the formation of the magneto-optical trap. Alternatively, the splitting is carried out upstream of the amplifiers.

Figure 7:
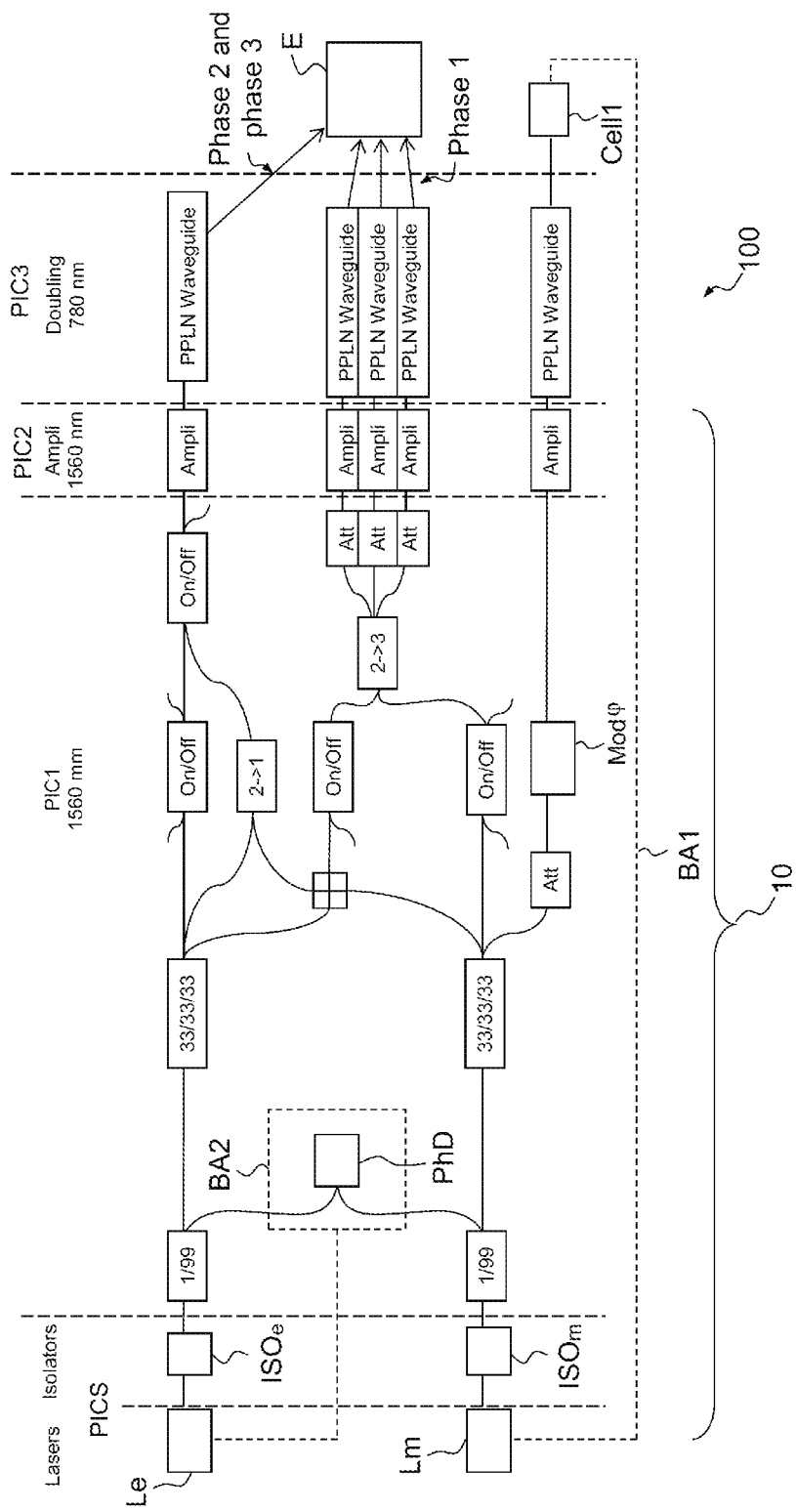
FIG. 7 illustrates an example laser source for a cold-atom sensor using an integrated optics technology.

An example of a cold-atom-sensor laser source, and the sensor 100 according to the invention, are illustrated in FIG. 7. The assembly of FIG. 7, with the exception of the chamber E and the saturable absorption cell Cell1, may be integrated to various degrees using integrated photonic components.

According to one preferred variant, the laser-source assembly 10 comprises, on a silicon substrate, a first integrated photonic circuit PIC1, comprising at least the second control loop BA2 and some of the optical components necessary to generate the various optical beams for the implementation of the sensor. Optionally, the circuit PIC1 also comprises some of the loop BA1, except the saturated absorption cell Cell1.

Preferably, the laser-source assembly 10 comprises, on an InP substrate, a second integrated photonic circuit PIC 2 comprising the optical amplifiers.

Advantageously, the laser-source assembly 10 comprises a third integrated photonic circuit PIC3 comprising the doubling components, which take the form of waveguides made of PPLN.

Preferably, the first integrated photonic circuit PIC1 comprises the phase modulator of the first locking loop BA1 and/or the second integrated photonic component PIC2 comprises the amplifier of the first locking loop and/or the third integrated photonic circuit PIC3 comprises the doubling component of the first locking loop.

In one embodiment, the first, second and/or third integrated photonic circuits are hybridized with the adjacent integrated photonic circuits so as to be integrated into the same chip. In a completely integrated version, a hybridized matrix-array of PPLN doublers is used in the photonic circuit.

These various integrated photonic circuits replace all or some of the complex optical system of the prior art required to implement a cold-atom sensor.

According to one embodiment, the laser-source assembly 10 according to the invention comprises a source integrated photonic circuit PICs comprising the lasers Le and Lm and associated isolators ISOe and ISOm. According to another embodiment, the lasers and their isolator are connected to the circuit PIC1 with optical fibers.

According to one all-integrated embodiment, the source integrated photonic circuit PICs and the first, second and third integrated photonic circuits PIC1, PIC2 and PIC3 are hybridized so as to be integrated into the same chip PIC.

According to one variant, a strip of free-space or fiber-based isolators is used to protect the diodes in the case where the laser diodes are remote from the integrated circuit. In the case where the laser sources are hybridized in the circuit, according to one variant isolators that are directly integrated into the photonic circuit PIC are used, these isolators for example employing layers of Faraday materials or even creating nonreciprocal Brillouin scattering in order to make a guide transparent in one direction only.

The components listed below are compatible with an integration into a silicon chip, such as schematically shown in FIG. 7, comprising integrated photonic components for creating and manipulating the various beams required to manipulate the cold atoms and to stabilize the various laser diodes:

1/99 (1 to 2) and 33/33/33 (1 to 3) splitters, static 2 to 1 and 2 to 3 (or 2 to 6) couplers and crossover between guides produced in CMOS technology;

Attenuator adjustable from 0 to −10 dB without constraint on the passband.

These variable attenuators may be produced using a Mach-Zehnder approach, or variable splitters an output of which serves to divert the undesired power. For the manipulation of cold atoms, the extinction ratio of the lasers must be relatively high and to this end a plurality of attenuators may be used one after the other.

On/Off: for example 2 to 2 couplers may be changed in a time of the order of a microsecond. With an extinction ratio of −20 dB.

A photodiode PhD at 1560 nm for the stabilization of the lasers with a passband of 3.5 GHz.

Fiber-based input-output, for example with grating coupling.

Phase modulator Mod φ (achieved for example by carrier injection).

Phase-locked loop in integrated photonic technology (for example in CMOS electronics technology).

Isolator using non-reciprocal effects obtained, for example, with thin layers of Faraday-effect materials or even by means of Brillouin scattering induced transparency (BSIT).

FIG. 8 illustrates an example of a cold-atom inertial sensor according to the invention comprising an all-integrated laser-source assembly integrated into a single photonic circuit PIC. The integrated photonic circuit PIC contains its own master and slave lasers, which are formed (amplified and doubled) then coupled to optical fibers $FO_1$ and $FO_{23}$ at the output of the photonic circuit. These fibers are placed nearest the vacuum chamber E and the beams output from these fibers serve to cool, pump and detect the atoms. In the schematic, a magneto-optical trap that comprises a cube corner CC and that requires only a single initial beam for the cooling is used by way of nonlimiting example.

The invention claimed is:

1. A laser-source assembly that is configured to illuminate a vacuum chamber (E) containing atoms (At) in the gaseous state so as to implement a cold-atom inertial sensor, said atoms having at least two fundamental levels that are separated by a fundamental frequency difference ($\delta f_0$) comprised between 1 and a few gigahertz, said assembly comprising:

a master laser (Lm) that emits a beam having a master frequency (fm);

a first control loop (BA1) that is configured to stabilize the master frequency of the master laser on a frequency corresponding to half a set frequency of an atomic transition between a fundamental level and an excited level of said atoms;

a slave laser (Le) that has a slave frequency (fe); and a second control loop (BA2) that is configured to stabilize the slave frequency of the slave laser with respect to the master frequency (fm), said second control loop (BA2) being made up of an optical phase-locked loop (OPLL) that is configured to achieve the stabilization on the basis of an error signal (ε) that is dependent on a phase difference between, on the one hand, a beat (fm-fe) between the master frequency and the slave frequency, and, on the other hand, a reference signal having a reference frequency defined beforehand on the basis of a preset offset value, the master frequency (fm) is set so that it corresponds to half a re-pumping frequency ($f_{Repomp}$) of said atoms;

the slave frequency (fe) is offset with respect to the master frequency (fm) successively, over time, by a first preset offset value ($\delta f1$), a second preset offset value ($\delta f2$) and a third preset offset value ($\delta f3$), said offset values being comprised in an interval equal to half the fundamental frequency difference ($\delta f_0$) plus or minus a few hundred MHz, the first, second and third successive slave frequency values (fe1, fe2, fe3), corresponding to the master frequency (fm) offset by the first offset value ($\delta f1$), second offset value ($\delta f2$) and third offset value ($\delta f3$), respectively, are set so that they correspond to half a cooling frequency ($f_{Refroid}$), to half an optical pumping frequency ($f_{Pomp}$) and to half a detection frequency ($f_{det}$) of said atoms during the implementation of an inertial sensor, respectively; and both master laser and slave laser being intended to illuminate the vacuum chamber containing atoms used for a measurement with the sensor.

2. The laser-source assembly as claimed in claim 1, wherein the optical phase-locked loop comprises:

a photodiode (Ph) that is configured to detect the beat (fm-fe) between the master frequency and the slave frequency;

a mixer (M) that is configured to deliver, on the basis of said beat, a converted signal of lower frequency compatible with an operating range of a phase comparator (Compφ);

a reference oscillator (Oref) that is configured to deliver a radio reference signal having a radio reference frequency (frefr) that is defined beforehand on the basis of a preset offset value;

a phase comparator (Compφ) that is configured to deliver an error signal (ε) that is dependent on the phase difference between the converted signal and the radio reference signal; and an electronic feedback device (ER) that is configured to act on the slave frequency of the slave laser so as to minimize said error signal.

3. The laser-source assembly as claimed in claim 1, wherein the first control loop (BA1) comprises a phase modulator (Mod φ), an amplifier, a frequency-doubling component and a saturable absorption cell comprising the same species of atoms (At) as those used for the implementation of an inertial sensor.

4. The laser-source assembly as claimed in claim 1, wherein the slave and master lasers are distributed feedback laser diodes.

5. The laser-source assembly as claimed in claim 1, furthermore comprising a beam-forming stage comprising:

a plurality of optical amplifiers (A) that are configured to amplify the beams generated by the frequency-stabilized lasers; and a plurality of frequency-doubling components (D) that are configured to double the frequency of said amplified beams.

6. The laser-source assembly as claimed in claim 1, wherein the laser sources emit a wavelength of 1560 nm and the amplifiers are semiconductor optical amplifiers.

7. The laser-source assembly as claimed in claim 1, comprising, on a silicon substrate, a first integrated photonic circuit (PIC1) comprising the second control loop (BA2) and some of the optical components required to generate the optical beams for the implementation of said sensor.

8. The laser-source assembly as claimed in claim 7, wherein the first integrated photonic circuit furthermore comprises the phase modulator (Mod φ) of the first control loop (BA1).

9. The laser-source assembly as claimed in claim 1, comprising, on an InP substrate, a second integrated photonic circuit (PIC2) comprising the amplifiers and/or comprising a third integrated photonic circuit (PIC3) comprising the frequency-doubling components, which take the form of waveguides made of PPLN.

10. The laser-source assembly as claimed in claim 7, wherein the first, and where appropriate the second and where appropriate the third integrated photonic circuit are hybridized so as to be integrated into the same chip.

11. The laser-source assembly as claimed in claim 1, comprising a source integrated photonic circuit (PICs) comprising the master laser, the slave laser and associated isolators.

12. The laser-source assembly as claimed in claim 1, wherein the source integrated photonic circuit (PICs), the first integrated photonic circuit (PIC1), the second integrated photonic circuit (PIC2) and the third integrated photonic circuit (PIC3) are hybridized so as to be integrated into the same chip.

13. A cold-atom inertial sensor comprising a laser-source assembly as claimed in claim 1 and further comprising the vacuum chamber (E) containing the atoms (At) in the gaseous state.

* * * * *